(12) United States Patent
Nakazawa et al.

(10) Patent No.: US 6,972,488 B2
(45) Date of Patent: Dec. 6, 2005

(54) SEMICONDUCTOR DEVICE IN WHICH A SEMICONDUCTOR CHIP MOUNTED ON A PRINTED CIRCUIT IS SEALED WITH A MOLDED RESIN

(75) Inventors: Taibo Nakazawa, Kanagawa (JP); Hiroyuki Kimura, Shiranuhi-machi (JP)

(73) Assignee: NEC Compound Semiconductor Devices, Ltd. (JP)

( * ) Notice: Subject to any disclaimer, the term of this patent is extended or adjusted under 35 U.S.C. 154(b) by 47 days.

(21) Appl. No.: 10/372,569

(22) Filed: Feb. 21, 2003

(65) Prior Publication Data

US 2003/0127732 A1 Jul. 10, 2003

Related U.S. Application Data

(62) Division of application No. 10/202,804, filed on Jul. 25, 2002.

(30) Foreign Application Priority Data

Jul. 31, 2001 (JP) .......................................... 2001-232184

(51) Int. Cl.⁷ .......................... H01L 23/50; H01L 23/48; H01L 23/02; H01L 29/161
(52) U.S. Cl. ........................ 257/723; 257/774; 257/773; 257/784; 257/786; 257/698; 257/691; 257/667; 257/787; 257/788; 257/795; 361/774; 361/761
(58) Field of Search ................................. 257/787, 788, 257/774, 773, 698, 692, 693, 786, 783, 790, 795, 691, 667, 784; 361/774, 761

(56) References Cited

U.S. PATENT DOCUMENTS

| | | | | |
|---|---|---|---|---|
| 5,177,593 A | * | 1/1993 | Abe .............................. | 257/98 |
| 5,693,980 A | * | 12/1997 | Sugahara ..................... | 257/706 |
| 5,731,709 A | * | 3/1998 | Pastore et al. .............. | 324/760 |
| 5,959,356 A | * | 9/1999 | Oh .............................. | 257/738 |
| 6,034,422 A | * | 3/2000 | Horita et al. ................ | 257/677 |
| 6,097,089 A | * | 8/2000 | Gaku et al. .................. | 257/712 |
| 6,097,100 A | * | 8/2000 | Eguchi et al. ............... | 257/787 |
| 6,101,098 A | * | 8/2000 | Noda .......................... | 361/760 |
| 6,221,690 B1 | * | 4/2001 | Taniguchi et al. ........... | 438/106 |
| 6,242,802 B1 | * | 6/2001 | Miles et al. ................. | 257/738 |
| 6,265,767 B1 | * | 7/2001 | Gaku et al. .................. | 257/678 |
| 6,265,783 B1 | * | 7/2001 | Juso et al. ................... | 257/786 |
| 6,350,952 B1 | * | 2/2002 | Gaku et al. ................. | 174/52.2 |
| 6,396,143 B1 | * | 5/2002 | Kimbara et al. ............. | 257/712 |
| 6,531,766 B1 | * | 3/2003 | Taniguchi et al. ........... | 257/678 |
| 6,717,819 B1 | * | 4/2004 | Chung ......................... | 361/760 |
| 2002/0020909 A1 | * | 2/2002 | Wakashima et al. ......... | 257/697 |
| 2002/0043705 A1 | * | 4/2002 | Ito et al. ...................... | 257/678 |
| 2002/0106833 A1 | * | 8/2002 | Kobayashi ................... | 438/108 |
| 2003/0102151 A1 | * | 6/2003 | Hirose et al. ................ | 174/250 |
| 2003/0102547 A1 | * | 6/2003 | Higashi et al. .............. | 257/686 |
| 2003/0129383 A1 | * | 7/2003 | Yamamoto et al. ....... | 428/317.7 |
| 2004/0026767 A1 | * | 2/2004 | Sato et al. ................... | 257/678 |

FOREIGN PATENT DOCUMENTS

| | | | | |
|---|---|---|---|---|
| JP | 58-64056 | * | 4/1983 | .................. 257/666 |
| JP | 05-036881 | | 2/1993 | ........... H01L/23/50 |
| JP | 06-45496 | | 2/1994 | ........... H01L/23/50 |
| JP | 09-129808 | | 5/1997 | ........... H01L/23/50 |
| JP | 11-260954 | * | 9/1999 | |
| JP | 2001-298117 | * | 10/2001 | |
| JP | 2002-270973 | * | 9/2002 | |

* cited by examiner

*Primary Examiner*—Alexander Oscar Williams
(74) *Attorney, Agent, or Firm*—Hayes Soloway P.C.

(57) ABSTRACT

A semiconductor device includes (a) a printed wiring board, (b) a semiconductor chip mounted on the printed wiring board, (c) a molded resin formed on the printed wiring board, covering the semiconductor chip therewith, and (d) at least one metal wiring formed on the printed wiring board and extending externally beyond the molded resin. The metal wiring is plated with a metal having a small adhesion force with the molded resin. An interfacial surface between the metal and the molded resin acts as a path through which moisture contained in the semiconductor device escapes outside when the semiconductor device is heated.

8 Claims, 8 Drawing Sheets

FIG.2A
PRIOR ART
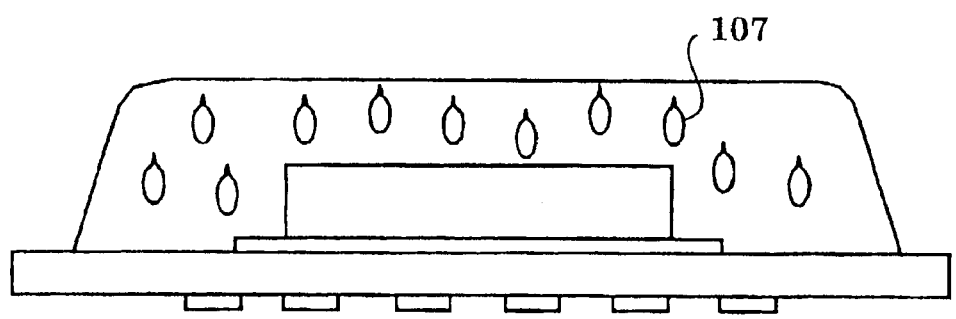
HEATING
FIG.2B
PRIOR ART
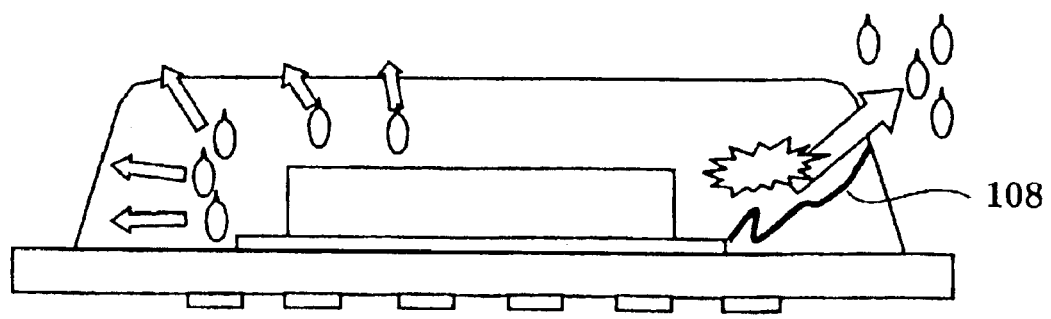

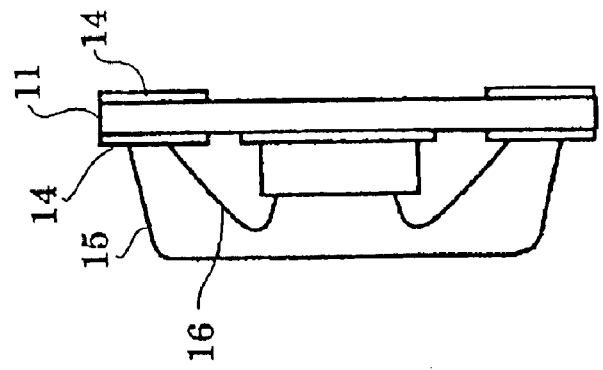
FIG.3C
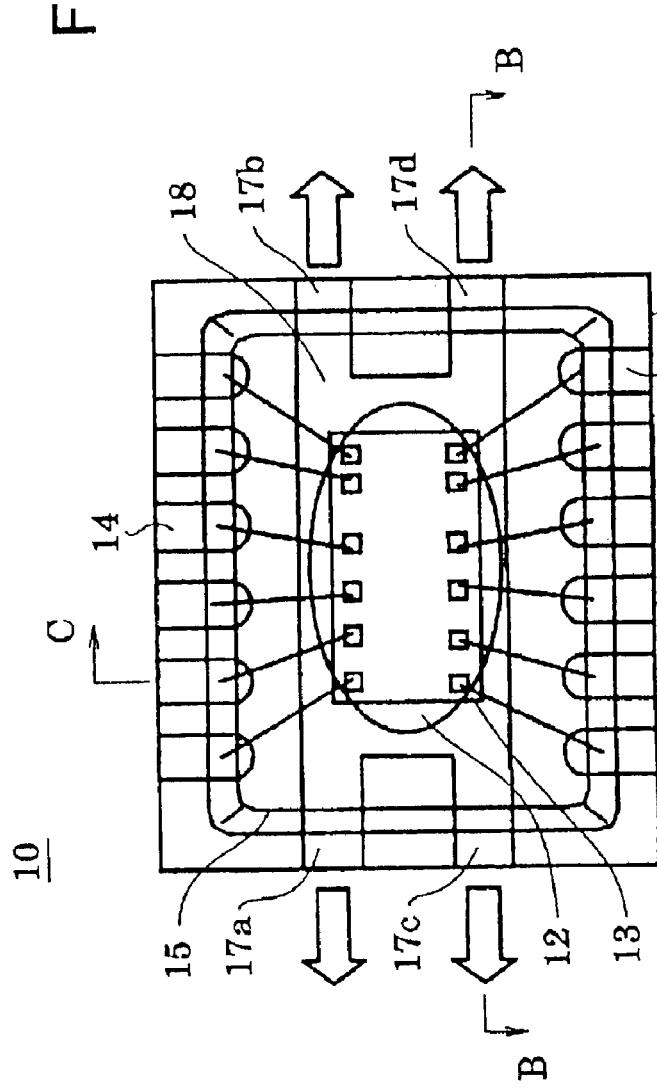
FIG.3A
FIG.3B

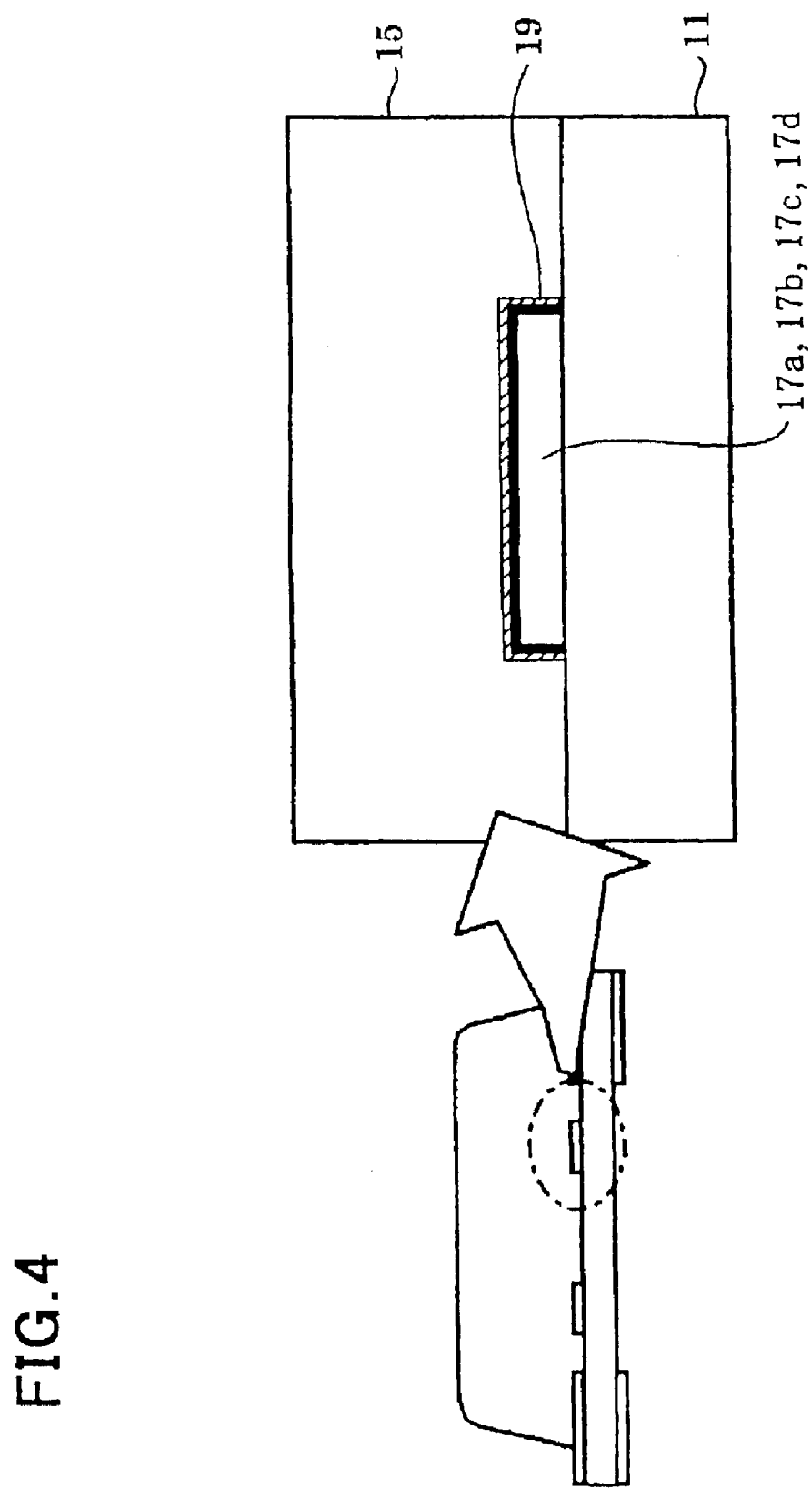

FIG.5A
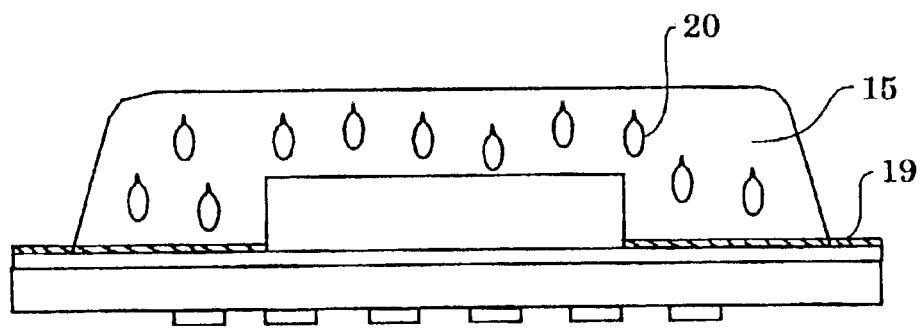
HEATING
FIG.5B
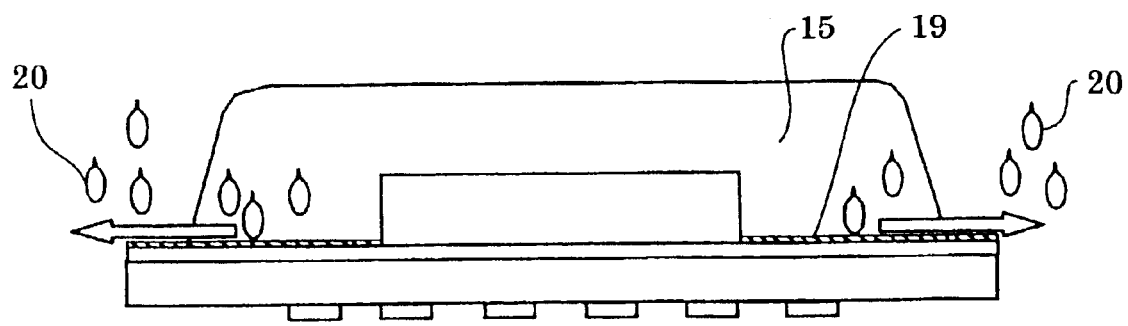

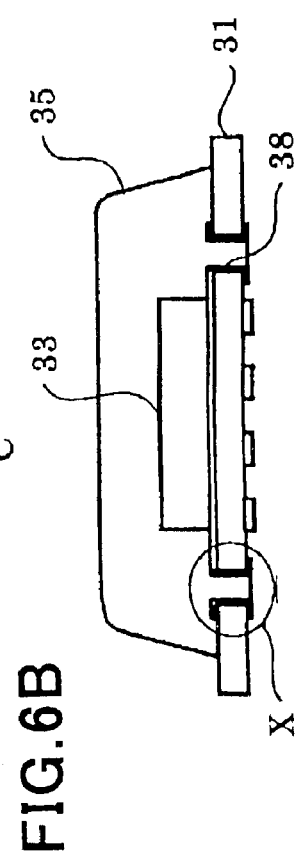
FIG.6C
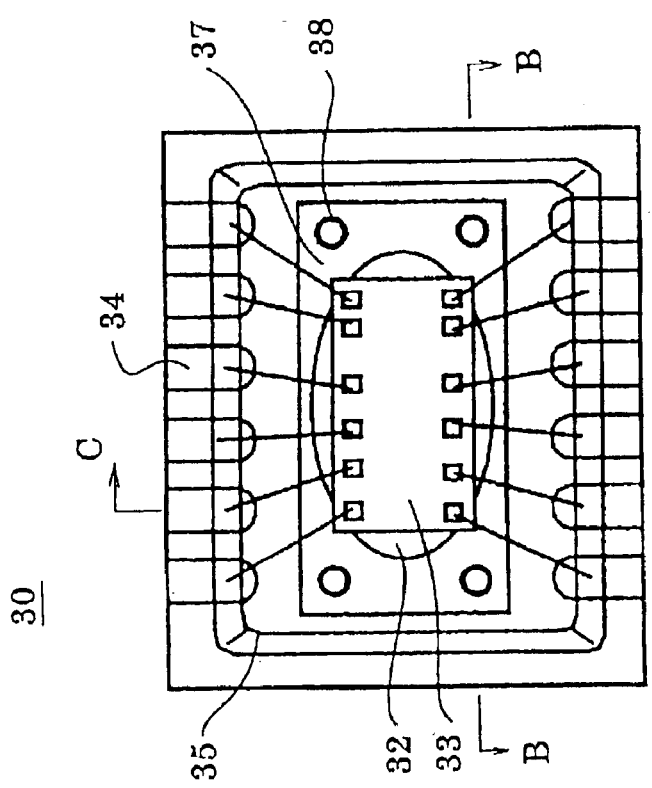
FIG.6A
FIG.6B

SEMICONDUCTOR DEVICE IN WHICH A SEMICONDUCTOR CHIP MOUNTED ON A PRINTED CIRCUIT IS SEALED WITH A MOLDED RESIN

CROSS REFERENCE TO RELATED APPLICATION

This Application is a divisional of U.S. application Ser. No. 10/202,804, filed Jul. 25, 2002.

BACKGROUND OF THE INVENTION

1. Field of the Invention

The invention relates to a semiconductor device, and more particularly to a so-called sealed type semiconductor device in which a semiconductor chip mounted on a printed wiring board is sealed with a molded resin.

2. Description of the Related Art

An example of a conventional sealed type semiconductor device is illustrated in FIGS. 1A to 1C. FIG. 1A is a top plan view of a conventional sealed type semiconductor device 100, FIG. 1B is a cross-sectional view taken along the line B—B in FIG. 1A, and FIG. 1C is a cross-sectional view taken along the line C—C in FIG. 1A.

As illustrated in FIGS. 1A to 1C, the conventional sealed type semiconductor device 100 is comprised of a printed wiring board 101 on which wirings are formed in a predetermined pattern, a mount 102 fixed on a surface of the printed wiring board 101, a semiconductor chip 103 mounted on the mount 102, a plurality of bonding pads 104 formed on upper and lower surfaces of the printed wiring board 101 for electrically connecting the printed wiring board 101 to an external circuit therethrough, a molded resin 105 formed on the printed wiring board 101, covering the semiconductor chip 103 therewith, and a plurality of boding wires 106 through which electrodes formed on the semiconductor chip 103 are electrically connected to the bonding pads 104.

Before a semiconductor chip is sealed with a resin, the semiconductor chip is mounted on a lead frame, and then, electrodes of the semiconductor chip are electrically connected to inner leads through bonding wires. When the semiconductor chip is sealed with a resin, a resin containing filler is usually selected.

In order to equalize a coefficient of thermal expansion of a resin to a coefficient of thermal expansion of a lead frame, a filler-containing resin is designed to contain filler materials having a smaller coefficient of thermal expansion than that of a resin to thereby reduce a coefficient of thermal expansion of the filler-containing resin.

When the semiconductor chip 103 is mounted on the printed wiring board 101 and the semiconductor chip 103 is sealed with the resin 105 like the semiconductor device 100 illustrated in FIGS. 1A to 1C, if the semiconductor device 103 were an optic semiconductor chip, it would be necessary to use a transparent resin as the resin 105 in order to allow a light to reach the optic semiconductor chip.

A semiconductor device including such an optic semiconductor chip could have reduced reliability relative to a semiconductor device including a semiconductor chip sealed with a filler-containing resin.

In general, filler is not mixed to a transparent resin. This is because if filler were mixed to a transparent resin, an index of refraction of the transparent resin would be changed, resulting in a light incident to an optic semiconductor device fluctuating, and difficulty directing light to a target position on an optic semiconductor chip.

Since a transparent resin does not contain filler for the above-mentioned reasons, a transparent resin does not have a small coefficient of thermal expansion, unlike that of a filler-containing resin, and would contain more moisture than a filler-containing resin.

In addition, since a resin has a high coefficient of thermal expansion, a gap is likely to be formed between a resin and a metal wire or between a resin and a substrate, resulting in that moisture is unavoidably residual in such a gap.

Thus, since the molded rein 105 has high hydroscopic property and further has a high coefficient of thermal expansion, it would be unavoidable for the semiconductor device 100 to contain moisture 107 to some degree, as illustrated in FIG. 2A.

A substrate is often coated with a solder resist in order to prevent solder from adhering to the substrate. Since the molded resin 105 and such a substrate have high adhesion force with each other, it would be quite difficult for the moisture 107 to escape out of the semiconductor device 100.

If a re-flow step is carried out while the semiconductor device 100 contains the moisture 107, for instance, since the moisture 107 could not escape out of the semiconductor device 100, the moisture 107 would expand in the semiconductor device 100, resulting in a problem that the semiconductor device 100 is cracked or peeled off as indicated with a reference number 108 in FIG. 2B.

For instance, such a crack directs to an inside of the molded resin 105 from the resin and the metal wire, such a crack directs to an inside of the molded resin 105 from the resin and the substrate, the resin and the metal wire are peeled off each other, or the resin and the substrate are peeled off each other.

Japanese Unexamined Patent Publication No. 6-45496 (A) has suggested a semiconductor device including a stage on which a semiconductor chip is mounted is formed integral with a frame through a plurality of support bars, and a metal conductor comprised of leads arranged around the stage and packaged with a molded resin, wherein each of the support bars has an increased width at which the support bar is connected to the stage, and has a reduced width at which the support bar is connected to the frame.

Japanese Unexamined Patent Publication No. 9-129808 (A) has suggested a resin-sealed type semiconductor device including an island on which a semiconductor chip is mounted, a plurality of terminal leads including inner and outer leads, and a wing lead extending from the island for allowing moisture contained in a resin to escape out of the semiconductor device. The wing lead is formed on a plane different from a plane on which the terminal leads are arranged.

However, the above-mentioned Publications cannot solve the problem mentioned earlier.

SUMMARY OF THE INVENTION

In view of the above-mentioned problem in the conventional semiconductor device, it is an object of the present invention to provide a sealed type semiconductor device including a semiconductor chip mounted on a printed wiring board and sealed with a molded resin, which semiconductor device is capable of preventing occurrence of crack and/or peeling off therein, even if the semiconductor device is subject to a heating step such as a re-flow step.

In one aspect of the present invention, there is provided a semiconductor device including (a) a printed wiring board, (b) a semiconductor chip mounted on the printed wiring board, (c) a molded resin formed on the printed wiring board, covering the semiconductor chip therewith, and (d) at least one metal wiring formed on the printed wiring board and extending externally beyond the molded resin, the metal wiring being plated with a metal having a small adhesion force with the molded resin, wherein an interfacial surface between the metal and the molded resin acts as a path through which moisture contained in the semiconductor device escapes outside when the semiconductor device is heated.

In the semiconductor device in accordance with the present invention, at least one metal wiring which is not used as an electrical connector or which is used also as an electrical connector is formed to extend externally beyond the molded resin. The metal wiring is plated at its surface with a first metal having a small adhesion force with the molded resin. Hence, an interfacial surface between the first metal and the molded resin can act as a path through which moisture passes. Accordingly, when a semiconductor device is heated in a step such as a re-flow step, and hence, moisture contained in the semiconductor device expands, the expanding moisture goes forward through the interfacial surface between the first metal and the molded resin, and then, discharged externally of the semiconductor device. In accordance with the semiconductor device, unlike the conventional sealed type semiconductor device, it would be possible to allow moisture contained in the semiconductor device to escape externally of the semiconductor device, and hence, prevent the semiconductor device from internally cracking and/or peeling off which would be caused by expansion of moisture contained in the semiconductor device.

There is further provided a semiconductor device including (a) a printed wiring board, (b) a semiconductor chip mounted on the printed wiring board, and (c) a molded resin formed on the printed wiring board, covering the semiconductor chip therewith, wherein the printed wiring board is formed with at least one through-hole, the through-hole is filled with the molded resin or another resin with the through-hole being plated at an inner wall thereof with a metal having a small adhesion force with the molded resin or the another resin, and an interfacial surface between the metal and the molded resin or the another resin acts as a path through which moisture contained in the semiconductor device escapes outside when the semiconductor device is heated.

In the semiconductor device in accordance with the present invention, the printed wiring board is formed with at least one through-hole. The through-hole is plated at its inner wall with a second metal having a small adhesion force with the molded resin or another resin filling the through-hole therewith. Under such circumstance, the through-hole is filled with the molded resin or the another resin. Hence, an interfacial surface between the second metal and the molded resin or the another resin can act as a path through which moisture passes. Accordingly, when a semiconductor device is heated in a step such as a re-flow step, and hence, moisture contained in the semiconductor device expands, the expanding moisture goes forward through the interfacial surface between the second metal and the molded resin or the another resin, and then, discharged externally of the semiconductor device. In accordance with the semiconductor device, unlike the conventional sealed type semiconductor device, it would be possible to allow moisture contained in the semiconductor device to escape externally of the semiconductor device, and hence, prevent the semiconductor device from internally cracking and/or peeling off which would be caused by expansion of moisture contained in the semiconductor device.

The above-mentioned at least one metal wiring may be comprised of a metal wiring formed in a region where a solder resist is not formed and plated with a metal. A solder resist may be formed in a region other than a region where the metal wiring is formed.

When a metal wiring formed on a printed wiring board is plated with a metal, a solder resist is first coated in a region which is not to be plated, and then, a metal wiring formed on a printed wiring board in a region where a solder resist is not coated is plated with a metal. The above-mentioned at least one metal wiring may be formed by this process. Specifically, there is determined a first region where a metal wiring is to be formed, apart from a region where a solder resist is to be coated. The thus determined first area is not coated with a solder resist, but plated with a metal. As a result, an interfacial surface between the molded resin and a metal plating layer coated around the metal wiring can act as a path through which moisture contained in the semiconductor device escapes externally of the semiconductor device.

As a metal having a small adhesion force with a resin, there may be selected a noble metal. It is preferable to select gold among a noble metal. In place of gold, there may be selected platinum or palladium.

As an alternative, a metal having a small adhesion force with a resin is not to be limited to a noble metal. Any metal may be used, if it has a small adhesion force with a resin.

There is still further provided a semiconductor device including (a) a printed wiring board, (b) a semiconductor chip mounted on the printed wiring board, and (c) a molded resin formed on the printed wiring board, covering the semiconductor chip therewith, wherein the printed wiring board has a first area in which a solder resist is not formed, the first area is formed such that a metal wiring formed in the first area and plated with a metal extends externally beyond the molded resin, and an interfacial surface between the metal wiring and the molded resin acts as a path through which moisture contained in the semiconductor device escapes outside when the semiconductor device is heated.

As mentioned earlier, when a metal wiring formed on a printed wiring board is plated with a metal, a solder resist is first coated in a region which is not to be plated, and then, a metal wiring formed on a printed wiring board in a region where a solder resist is not coated is plated with a metal. By forming the metal wiring plated with a metal to extend externally beyond the molded resin, without coating with a solder resist, there can be formed a path through which moisture contained in the semiconductor device escapes externally of the semiconductor device. Specifically, there is determined a first region where a metal wiring is to be formed, apart from a region where a solder resist is to be coated. The thus determined first area is not coated with a solder resist, but plated with a metal. As a result, an interfacial surface between the molded resin and a metal plating layer coated around the metal wiring can act as a path through which moisture contained in the semiconductor device escapes externally of the semiconductor device.

Since a solder resist is composed of a resin similar to the molded resin, such as epoxy, an adhesion force between a solder resist and the molded resin is quite higher than an adhesion force between the molded resin and a metal plating layer. An adhesion force between the molded resist and a metal wiring (for instance, composed of copper) coated with a solder resist, but not plated with a metal is higher than an adhesion force between the molded resin and a metal plating layer.

In contrast, an adhesion force between a metal plating layer (for instance, composed of gold) with which a metal wiring is plated, and the molded resin is relatively small. That is, both of an adhesion force between a solder resist and the molded resin and an adhesion force between the molded resist and a metal wiring coated with a solder resist, but not plated with a metal are higher than an adhesion force between a metal plating layer with which a metal wiring is plated, and the molded resin. Accordingly, when moisture contained in the semiconductor device is to escape externally of the semiconductor device, the moisture passes through an interfacial surface where a small adhesion force exists, namely, an interfacial surface between a metal plating layer with which a metal wiring is plated, and the molded resin.

The present invention is based on this discovery. When a semiconductor device is heated in a step such as a re-flow step, and hence, moisture contained in the semiconductor device expands, the expanding moisture goes forward through an interfacial surface between a metal plating layer with which a metal wiring is plated, and the molded resin, and then, discharged externally of the semiconductor device. In accordance with the semiconductor device, unlike the conventional sealed type semiconductor device, it would be possible to allow moisture contained in the semiconductor device to escape externally of the semiconductor device, and hence, prevent the semiconductor device from internally cracking and/or peeling off which would be caused by expansion of moisture contained in the semiconductor device.

As mentioned earlier, a transparent resin does not contain filler material having a smaller coefficient of thermal expansion than that of a resin, and hence, tends to contain moisture. In accordance with the present invention, even if such a transparent resin is used as a molded resin, it would be possible to allow moisture contained in the semiconductor device to escape externally of the semiconductor device, and hence, prevent the semiconductor device from internally cracking and/or peeling off which would be caused by expansion of moisture contained in the semiconductor device.

There is yet further provided a semiconductor device including (a) a printed wiring board, (b) a semiconductor chip mounted on the printed wiring board, (c) a molded resin formed on the printed wiring board, covering the semiconductor chip therewith, and (d) at least one metal wiring formed on the printed wiring board and extending externally beyond the molded resin, the metal wiring being plated with a first metal having a small adhesion force with the molded resin, wherein the printed wiring board is formed with at least one through-hole, the through-hole is filled with the molded resin or another resin with the through-hole being plated at an inner wall thereof with a second metal having a small adhesion force with the molded resin or the another resin, and an interfacial surface between the first metal and the molded resin and an interfacial surface between the second metal and the molded resin or the another resin act as paths through which moisture contained in the semiconductor device escapes outside when the semiconductor device is heated.

In the semiconductor device in accordance with the present invention, at least one metal wiring which is not used as an electrical connector or which is used also as an electrical connector is formed to extend externally beyond the molded resin. In addition, the printed wiring board is formed with at least one through-hole. The through-hole is plated at its inner wall with a second metal having a small adhesion force with the molded resin or another resin filling the through-hole therewith. That is, the above-mentioned semiconductor device is designed as a combination of the firstly mentioned semiconductor device and the secondly mentioned semiconductor device. Hence, in accordance with the semiconductor device, unlike the conventional sealed type semiconductor device, it would be possible to allow moisture contained in the semiconductor device to escape externally of the semiconductor device, and hence, prevent the semiconductor device from internally cracking and/or peeling off which would be caused by expansion of moisture contained in the semiconductor device, similarly to the firstly and secondly mentioned semiconductor devices.

There is still yet further provided a semiconductor device including (a) a printed wiring board, (b) a semiconductor chip mounted on the printed wiring board, and (c) a molded resin formed on the printed wiring board, covering the semiconductor chip therewith, wherein the printed wiring board has a first area in which a solder resist is not formed, the first area is formed such that a metal wiring formed in the first area and plated with a metal extends externally beyond the molded resin, the printed wiring board is formed with at least one through-hole, the through-hole is filled with the molded resin or another resin with the through-hole being plated at an inner wall thereof with a second metal having a small adhesion force with the molded resin or the another resin, and an interfacial surface between the metal and the molded resin and an interfacial surface between the second metal and the molded resin or the another resin act as paths through which moisture contained in the semiconductor device escapes outside when the semiconductor device is heated.

In the semiconductor device, there is determined a first region where a metal wiring is to be formed, apart from a region where a solder resist is to be coated. The thus determined first area is not coated with a solder resist, but plated with a metal. As a result, an interfacial surface between the molded resin and a metal plating layer coated around the metal wiring can act as a path through which moisture contained in the semiconductor device escapes externally of the semiconductor device, similarly to the thirdly mentioned semiconductor device.

In addition, the printed wiring board is formed with at least one through-hole. The through-hole is plated at its inner wall with a second metal having a small adhesion force with the molded resin or another resin filling the through-hole therewith. That is, the above-mentioned semiconductor device is designed as a combination of the firstly mentioned semiconductor device, the secondly mentioned semiconductor device and the thirdly mentioned semiconductor device. Hence, in accordance with the semiconductor device, unlike the conventional sealed type semiconductor device, it would be possible to allow moisture contained in the semiconductor device to escape externally of the semiconductor device, and hence, prevent the semiconductor device from internally cracking and/or peeling off which would be caused by expansion of moisture contained in the semiconductor device, similarly to the firstly, secondly and thirdly mentioned semiconductor devices.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIG. 2A is a cross-sectional view of a conventional sealed type semiconductor device.

FIG. 2B is a cross-sectional view of a conventional sealed type semiconductor device including a cracked molded resin.

FIG. 3A is a top plan view of a sealed type semiconductor device in accordance with the first embodiment of the present invention.

FIG. 3B is a cross-sectional view taken along the line B—B in FIG. 3A.

FIG. 4 is an enlarged side view of the semiconductor device in accordance with the first embodiment of the present invention.

FIG. 5A is a cross-sectional view of the semiconductor device in accordance with the first embodiment of the present invention, illustrating how moisture contained in a molded resin behaves when the semiconductor device is heated.

FIG. 5B is a cross-sectional view of the semiconductor device in accordance with the first embodiment of the present invention, illustrating how moisture contained in a molded resin behaves when the semiconductor device is heated.

FIG. 6A is a top plan view of a sealed type semiconductor device in accordance with the second embodiment of the present invention.

FIG. 6B is a cross-sectional view taken along the line B—B in FIG. 6A.

FIG. 6C is a cross-sectional view taken along the line C—C in FIG. 6A.

DESCRIPTION OF THE PREFERRED EMBODIMENTS

Preferred embodiments in accordance with the present invention will be explained hereinbelow with reference to drawings.

[First Embodiment]

Figure 3C:
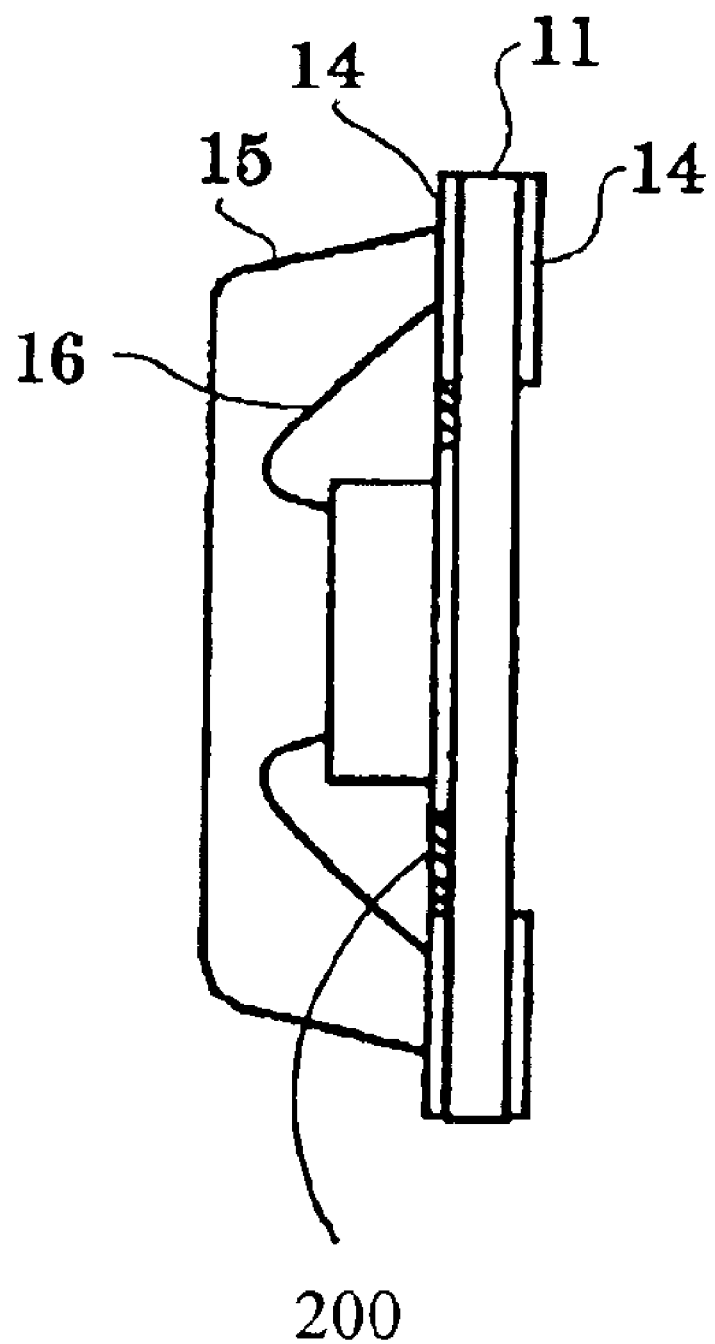
FIGS. 3C and 3C' are cross-sectional views taken along the line C—C in FIG. 3A.

A resin-sealed type semiconductor device in accordance with the first embodiment is illustrated in FIGS. 3A to 3C. FIG. 3A is a top plan view of the semiconductor device, FIG. 3B is a cross-sectional view taken along the line B—B in FIG. 3A, and FIG. 3C is a cross-sectional view taken along the line C—C in FIG. 3A.

As illustrated in FIGS. 3A to 3C, the resin-sealed type semiconductor device 10 in accordance with the first embodiment is comprised of a printed wiring board 11 on which wirings are formed in a predetermined pattern, a mount 12 fixed on a surface of the printed wiring board 11, a semiconductor chip 13 fixedly mounted on the mount 12, a plurality of bonding pads 14 formed on upper and lower surfaces of the printed wiring board 11 for electrically connecting the printed wiring board 11 to an external circuit therethrough, a transparent molded-resin 15 formed on the printed wiring board 11, covering the semiconductor chip 13 therewith, and a plurality of boding wires 16 through which electrodes formed on the semiconductor chip 13 are electrically connected to the bonding pads 14.

In the first embodiment, the transparent molded-resin 15 is composed of epoxy.

The resin-sealed type semiconductor device 10 in accordance with the first embodiment is designed to further include metal wirings 17a, 17b, 17c and 17d formed on the printed wiring board 11. The metal wirings 17a to 17d are not used as an electrical connector.

Specifically, as illustrated in FIG. 3A, a rectangular chip-mounting area 18 in which the semiconductor chip 13 is to be mounted is formed centrally of the printed wiring board 11 as a metal pattern, and the metal wirings 17a, 17b, 17c and 17d extend towards an outer edge of the printed wiring board 11 in parallel with one another from four corners of the chip-mounting area 18. The metal wirings 17a, 17b, 17c and 17d extend beyond the transparent molded-resin 15, and reach an outer edge of the printed wiring board 11. Since the metal wirings 17a, 17b, 17c and 17d are formed extending beyond the transparent molded-resin 15, they are in atmospheric air at distal ends thereof.

As illustrated in FIG. 4, each of the metal wirings 17a, 17b, 17c and 17d is plated, that is, coated with a gold plating layer 19.

An adhesion force between the gold plating layer 19 coating the metal wirings 17a, 17b, 17c and 17d therewith and the transparent molded-resin 15 is relatively small. In other words, the gold plating layer 19 and the transparent molded-resin 15 make contact with each other through such an adhesion force that moisture can pass through a small gap formed between the gold plating layer 19 and the transparent molded-resin 15.

Thus, an interfacial surface 300 between the gold plating layer 19 and the transparent molded-resin 15 acts as a path through which moisture can pass.

Accordingly, when the semiconductor device 10 is heated in a step such as a re-flow step and hence moisture 20 contained in the semiconductor device 10 expands, as illustrated in FIG. 5A, the expanding moisture 20 goes forward along an interfacial surface between the gold plating layer 19 and the transparent molded-resin 15, and then, discharged externally of the semiconductor device 10, as illustrated in FIG. 5B.

The inventors had conducted the experiments as follows in order to ensure the semiconductor device 10 in accordance with the first embodiment was not cracked and/or peeled off.

Figure 1C:
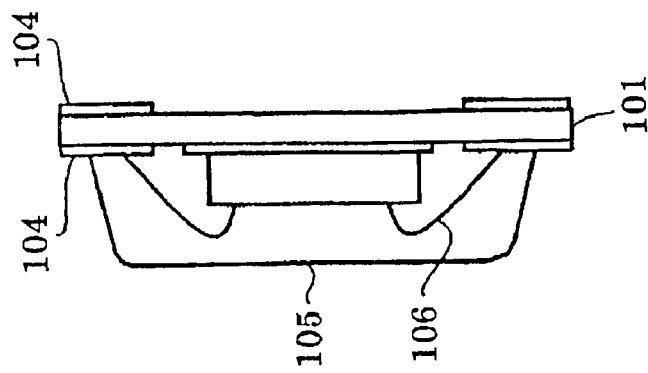
FIG. 1C is a cross-sectional view taken along the line C—C in FIG. 1A.
Figure 1A:
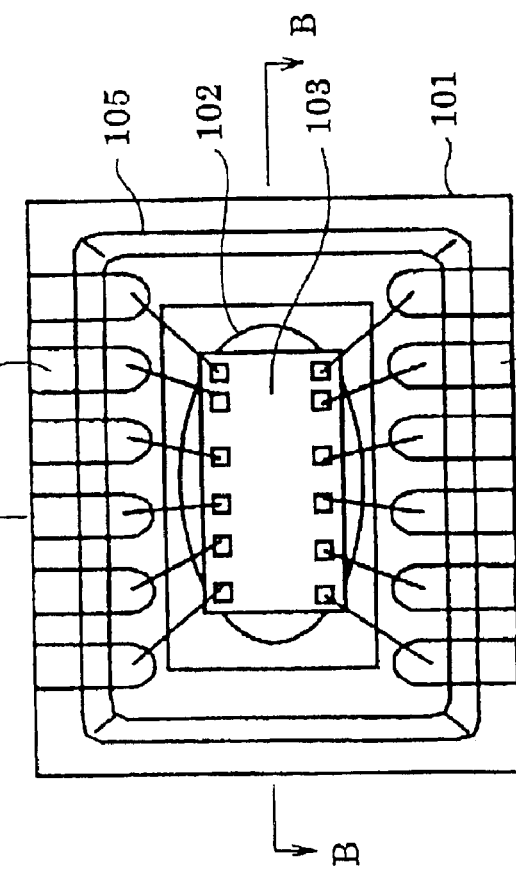
FIG. 1A is a top plan view of a conventional sealed type semiconductor device.
Figure 1B:
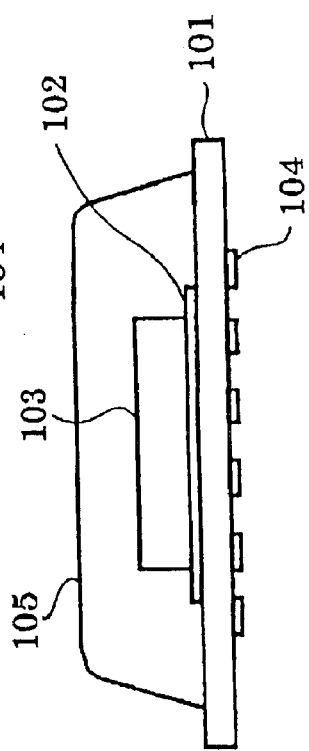
FIG. 1B is a cross-sectional view taken along the line B—B in FIG. 1A.

The inventors had fabricated both of the conventional semiconductor device 100 illustrated in FIGS. 1A to 1C and the semiconductor device 10 in accordance with the first embodiment, illustrated in FIGS. 3A to 3C, by the same number, and measured a rate R at which the semiconductor devices 100 and 10 were cracked and/or peeled off after carrying out a re-flow step.

The results are shown in Table 1.

TABLE 1

|  | RATE R |
| --- | --- |
| Semiconductor Device 100 (Conventional) | 41.7% |
| Semiconductor Device 10 (First Embodiment) | 3.3% |

As is obvious in view of Table 1, the semiconductor device 10 in accordance with the first embodiment is not cracked and peeled off at a higher rate than the conventional semiconductor device 100.

As having been explained so far, the resin-sealed type semiconductor device 10 in accordance with the first embodiment allows the moisture contained in the semiconductor device 10 to escape externally of the semiconductor device 10, and can avoid from being cracked due to the expansion of the moisture 20 contained in the semiconductor device 10.

[Second Embodiment]

Figure 7:
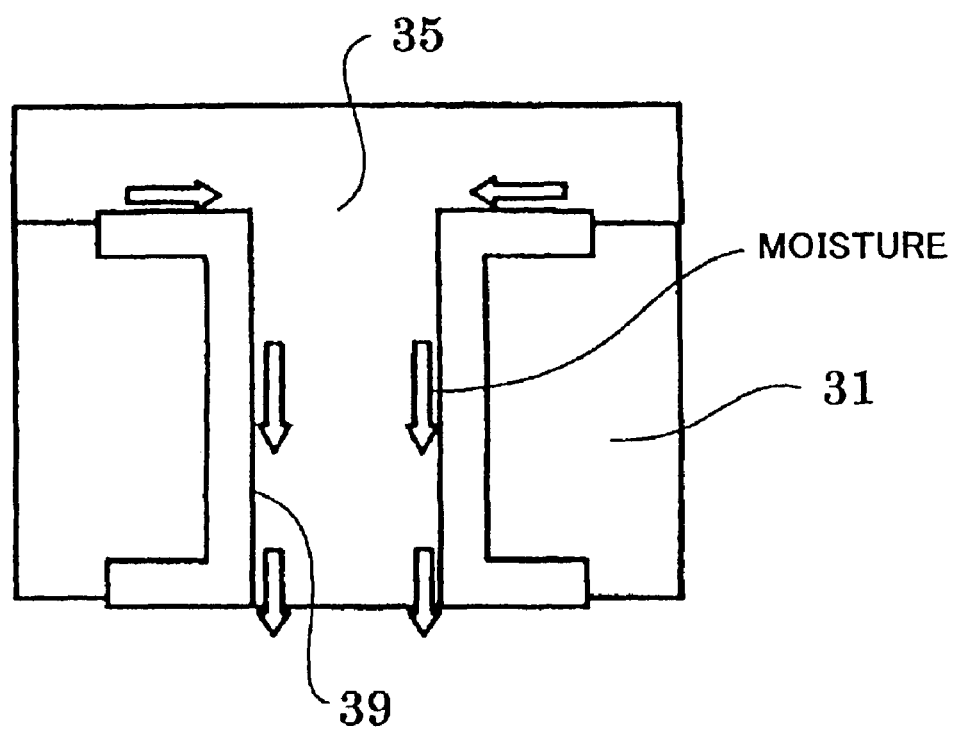
FIG. 7 is an enlarged view of an encircled portion X in FIG. 6B.

A resin-sealed type semiconductor device in accordance with the second embodiment is illustrated in FIGS. 6A to 6C and 7. FIG. 6A is a top plan view of the semiconductor device, FIG. 6B is a cross-sectional view taken along the line B—B in FIG. 6A, FIG. 6C is a cross-sectional view taken along the line C—C in FIG. 6A, and FIG. 7 is an enlarged view of an encircled portion X in FIG. 6B.

As illustrated in FIGS. 6A to 6C, the resin-sealed type semiconductor device 30 in accordance with the second embodiment is comprised of a printed wiring board 31 on which wirings are formed in a predetermined pattern, a mount 32 fixed on a surface of the printed wiring board 31, a semiconductor chip 33 fixedly mounted on the mount 32, a plurality of bonding pads 34 formed on upper and lower surfaces of the printed wiring board 31 for electrically connecting the printed wiring board 31 to an external circuit therethrough, a transparent molded-resin 35 formed on the printed wiring board 31, covering the semiconductor chip 33 therewith, and a plurality of bonding wires 36 through which electrodes formed on the semiconductor chip 33 are electrically connected to the bonding pads 34.

In the second embodiment, the transparent molded-resin 35 is composed of epoxy.

In the semiconductor device 30 in accordance with the second embodiment, as illustrated in FIG. 6A, the printed wiring board 31 is formed centrally with an almost rectangular chip-mounting area 37 in which the semiconductor chip 33 is to be mounted. As illustrated in FIGS. 6A and 6B, through-holes 38 are formed throughout the printed wiring board 31 in the vicinity of four corners of the chip-mounting area 37.

FIG. 7 is an enlarged view of the through-hole 38. Each of the through-holes 38 is plated at its inner wall with gold. In other words, each of the through-holes 38 is coated at its inner wall with a gold plating layer 39. Each of the through-holes 38 is filled with the transparent molded-resin 35 with its inner wall being coated with the gold plating layer 39. As an alternative, each of the through-holes 38 may be filled with a resin other than the transparent molded-resin 35.

An adhesion force between the gold plating layer 39 coating the through-holes 38 therewith and the transparent molded-resin 35 (or another resin) covering the gold plating layer 39 therewith is relatively small. In other words, the gold plating layer 39 and the transparent molded-resin 35 (or another resin) make contact with each other through such an adhesion force that heated moisture can be discharged externally of the semiconductor device 30 through a small gap formed between the gold plating layer 39 and the transparent molded-resin 35 (or another resin).

Thus, an interfacial surface between the gold plating layer 39 and the transparent molded-resin 35 (or another resin) acts as a path through which moisture can pass.

Accordingly, when the semiconductor device 30 is heated in a step such as a re-flow step and hence moisture contained in the transparent molded-resin 35 expands, the expanding moisture goes forward along an interfacial surface between the gold plating layer 39 and the transparent molded-resin 35, and then, discharged externally of the semiconductor device 30 through the through-holes 38.

As having been explained so far, the resin-sealed type semiconductor device 30 in accordance with the second embodiment allows the moisture contained in the semiconductor device 30 to escape externally of the semiconductor device 30 through the through-holes 38, and can avoid from being cracked and peeled off due to the expansion of the moisture contained in the semiconductor device 30.

In the above-mentioned embodiment, a noble plating layer such as a platinum plating layer or a palladium plating layer may be used in place of the gold plating layer 39.

[Third Embodiment]

Hereinbelow is explained a semiconductor device in accordance with the third embodiment, with reference to FIGS. 3A to 3C'.

When a metal wiring formed on a printed wiring board is plated with a metal, a solder resist 200 is first coated in a region which is not to be plated, and then, a metal wiring formed on a printed wiring board in a region where a solder resist 200 is not coated is plated with a metal. This process can be applied to the fabrication of the semiconductor device in accordance with the third embodiment.

In the semiconductor device in accordance with the third embodiment, there is intentionally formed, on the printed wiring board 11, a first region where a solder resist 200 is not to be formed, apart from a second region where a solder resist 200 is not to be coated in view of designing a wiring pattern. The first area is formed such that a metal wiring to be formed in the first area and plated with a metal extends externally beyond the transparent molded-resin 15.

Hence, thereafter, a metal wiring formed in the second area is plated with a metal. The thus formed interfacial surface between the transparent molded-resin 15 and a metal plating layer coated around the metal wiring can act as a path through which moisture contained in the semiconductor device escapes externally of the semiconductor device, similarly to the interfacial surface formed between the metal wirings 17a, 17b, 17c and 17d and the transparent molded-resin 15 in the first embodiment.

Since a solder resist 200 is composed of a resin similar to the molded resin, such as epoxy, an adhesion force between a solder resist 200 and the molded resin 15 is relatively high. Accordingly, when moisture contained in the semiconductor device is to escape externally of the semiconductor device, the moisture passes through an interfacial surface where a small adhesion force exists, namely, an interfacial surface between a metal plating layer with which a metal wiring is plated, and the molded resin 15.

In accordance with the semiconductor device, similarly to the semiconductor device 10 in accordance with the first embodiment, it would be possible to allow moisture contained in the semiconductor device to escape externally of the semiconductor device, and hence, prevent the semiconductor device from internally cracking and/or peeling off which would be caused by expansion of moisture contained in the semiconductor device.

Any one or more of the metal wirings 17a, 17b, 17c and 17d in the first embodiment may be formed as a metal wiring or metal wirings coated with a metal plating layer in accordance with the third embodiment.

The above-mentioned first to third embodiments may be reduced to practice alone or in combination.

Specifically, there may be currently formed both the metal wirings 17a, 17b, 17c and 17d in the first embodiment and a metal wiring coated with a metal plating layer in the third embodiment. As an alternative, there may be currently formed both the metal wirings 17a, 17b, 17c and 17d in the first embodiment and the through-holes 38 in the second embodiment. As an alternative, there may be currently formed both the through-holes 38 in the second embodiment and a metal wiring coated with a metal plating layer in the third embodiment. As an alternative, there may be currently formed all of the metal wirings 17a, 17b, 17c and 17d in the first embodiment, the through-holes 38 in the second embodiment, and a metal wiring coated with a metal plating layer in the third embodiment.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 2001-232184 filed on Jul. 31, 2001 including specification, claims, drawings and summary is incorporated herein by reference in its entirety.

What is claimed is:

1. A semiconductor device comprising:

a printed wiring board comprised of an electrically insulating substrate and a metal wiring formed on said substrate;

a semiconductor chip mounted on said metal wiring; and a molded resin formed on said metal wiring, covering said semiconductor chip therewith, wherein said metal wiring and said substrate are formed with at least one through-hole in a region other than a region in which said semiconductor chip is to be formed, said through-hole is filled with said molded resin with said through-hole being plated at an inner wall thereof with a noble metal having a small adhesion force with said molded resin, and further with said metal wiring being coated at a surface thereof with said noble metal, and an interfacial surface between said noble metal and said molded resin through which moisture contained in said semiconductor device escapes outside extends externally beyond said semiconductor device from said semiconductor chip.

2. The semiconductor device as set forth in claim 1, further comprising a solder resist formed in an area other than an area plated with said noble metal.

3. The semiconductor device as set forth in claim 1, wherein said noble metal is gold, platinum or palladium.

4. The semiconductor device as set forth in claim 1, wherein said molded resin is a transparent resin.

5. A semiconductor device comprising:

a printed wiring board comprised of an electrically insulating substrate and a metal wiring formed on said substrate;

a semiconductor chip mounted on said metal wiring;

a molded resin formed on said metal wiring, covering said semiconductor chip therewith; and at least one metal wiring formed on said metal wiring extending externally beyond said molded resin, and being plated with a first metal having a small adhesion force with said molded resin, wherein said metal wiring and said substrate are formed with at least one through-hole in a region other than a region in which said semiconductor chip is to be formed, said through-hole is filled with said molded resin with said through-hole being plated at an inner wall thereof with a second metal having a small adhesion force with said molded resin, and further with said metal wiring being coated at a surface thereof with said second metal; and an interfacial surface between said first metal and said molded resin and an interfacial surface between said second metal and said molded resin through which moisture contained in said semiconductor device escapes outside extend externally beyond said semiconductor device from said semiconductor chip.

6. A semiconductor device comprising:

a printed wiring board comprised of an electrically insulating substrate and a metal wiring formed on said substrate;

a semiconductor chip mounted on said metal wiring; and a molded resin formed on said metal wiring, covering said semiconductor chip therewith, wherein said printed wiring board has a first area in which a solder resist is not formed, said first area is formed such that a metal wiring formed in the first area and plated with a metal extends externally beyond said molded resin, said metal wiring and said substrate are formed with at least one through-hole in a region other than a region in which said semiconductor chip is to be formed, said through-hole is filled with said molded resin with said through-hole being plated at an inner wall thereof with a second metal having a small adhesion force with said molded resin, and further with said metal wiring being coated at a surface thereof with said metal, and an interfacial surface between said metal and said molded resin and an interfacial surface between said second metal and said molded resin through which moisture contained in said semiconductor device escapes outside extend externally beyond said semiconductor device from said semiconductor chip.

7. The semiconductor device as set forth in claim 4, wherein said transparent resin comprises an epoxy.

8. The semiconductor device as set forth in claim 1, further comprising a metal wiring and a bonding wire through which a bonding pad formed on said metal wiring and an electrode formed on said semiconductor chip are electrically connected to each other.

* * * * *